(12) United States Patent  
Sakai et al.

(10) Patent No.: US 9,190,337 B2
(45) Date of Patent: Nov. 17, 2015

(54) ETCHING METHOD

(71) Applicant: Tohoku University, Sendai-shi, Miyagi (JP)

(72) Inventors: Takeshi Sakai, Sendai (JP); Tatsuro Yoshida, Sendai (JP); Kazuhiro Yoshikawa, Sendai (JP); Shigetoshi Sugawa, Sendai (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/281,954

(22) Filed: May 20, 2014

(65) Prior Publication Data

US 2014/0256065 A1   Sep. 11, 2014

Related U.S. Application Data

(63) Continuation of application No. PCT/JP2012/004556, filed on Jul. 13, 2012.

(51) Int. Cl.
*H01L 21/66* (2006.01)
*H01L 21/306* (2006.01)
*H01L 21/67* (2006.01)
*H01L 27/146* (2006.01)

(52) U.S. Cl.
CPC .......... *H01L 22/26* (2013.01); *H01L 21/30604* (2013.01); *H01L 21/6708* (2013.01); *H01L 21/67109* (2013.01); *H01L 21/67248* (2013.01); *H01L 27/14683* (2013.01)

(58) Field of Classification Search
CPC .............. H01L 22/26; H01L 21/30604; H01L 21/67109; H01L 21/67248; H01L 21/6708; H01L 21/67086
See application file for complete search history.

(56) References Cited

U.S. PATENT DOCUMENTS

| 5,200,023 | A  | * | 4/1993  | Gifford et al. ............... 216/59 |
| 5,240,556 | A  | * | 8/1993  | Ishikawa et al. ............. 216/67 |
| 6,274,505 | B1 |   | 8/2001  | Ito et al. |
| 6,992,014 | B2 | * | 1/2006  | Grant et al. ................. 438/745 |
| 2004/0052963 | A1 | * | 3/2004 | Ivanov et al. ............. 427/443.1 |
| 2009/0032498 | A1 |   | 2/2009 | Tsuchiya et al. |
| 2013/0320477 | A1 | * | 12/2013 | Ohmi et al. ................. 257/447 |

FOREIGN PATENT DOCUMENTS

| JP | 61-142743 | 6/1986 |
| JP | 11-165114 | 6/1999 |
| JP | 2000-077381 | 3/2000 |
| JP | 2009-194088 | 8/2009 |
| WO | 2006/103773 | 10/2006 |
| WO | WO2012063425 A * | 5/2012 ............ H01L 21/306 |

OTHER PUBLICATIONS

Yoshikawa, et al., "Silicon Wafer Thinning Technology for Three-Dimensional Integrated Circuit by Wet Etching" IEICE Technical Report, vol. 120 (2009) 15-19.

* cited by examiner

*Primary Examiner* — Stephen W Smoot
*Assistant Examiner* — Sun M Kim
(74) *Attorney, Agent, or Firm* — Fitzpatrick, Cella, Harper & Scinto

(57) ABSTRACT

There is provided an etching method. A temperature at a plurality of predetermined positions on an upper surface of an Si substrate is measured during the etching processing. The etching processing includes supplying an etching solution to the upper surface of the Si substrate. An exothermic reaction occurs in the etching processing. The upper surface is heated or cooled depending on the measured value.

16 Claims, 19 Drawing Sheets

ROTATION DIRECTION OF SUBSTRATE

ROTATION CENTER (NOZZLE POSITION)

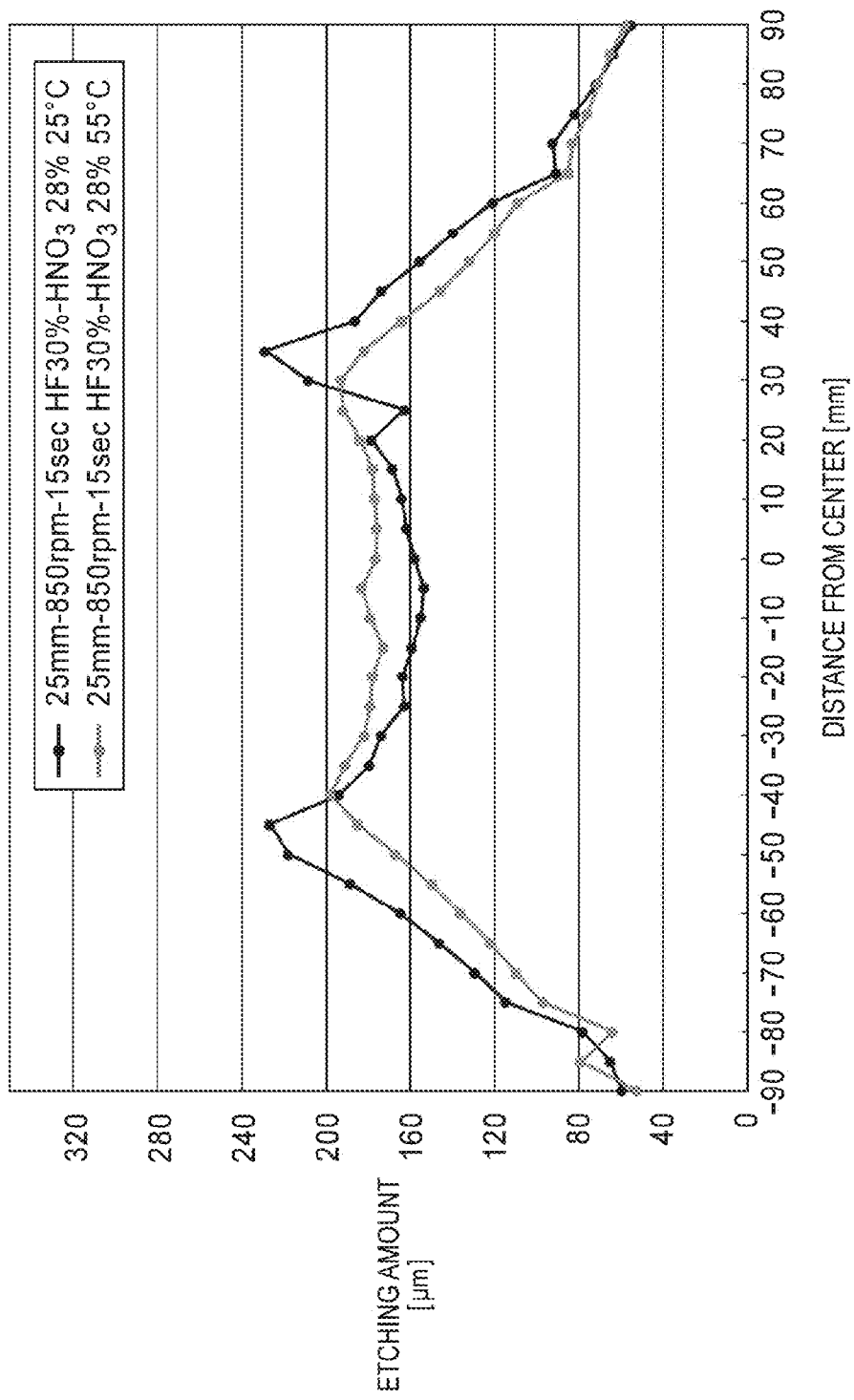
F I G. 12

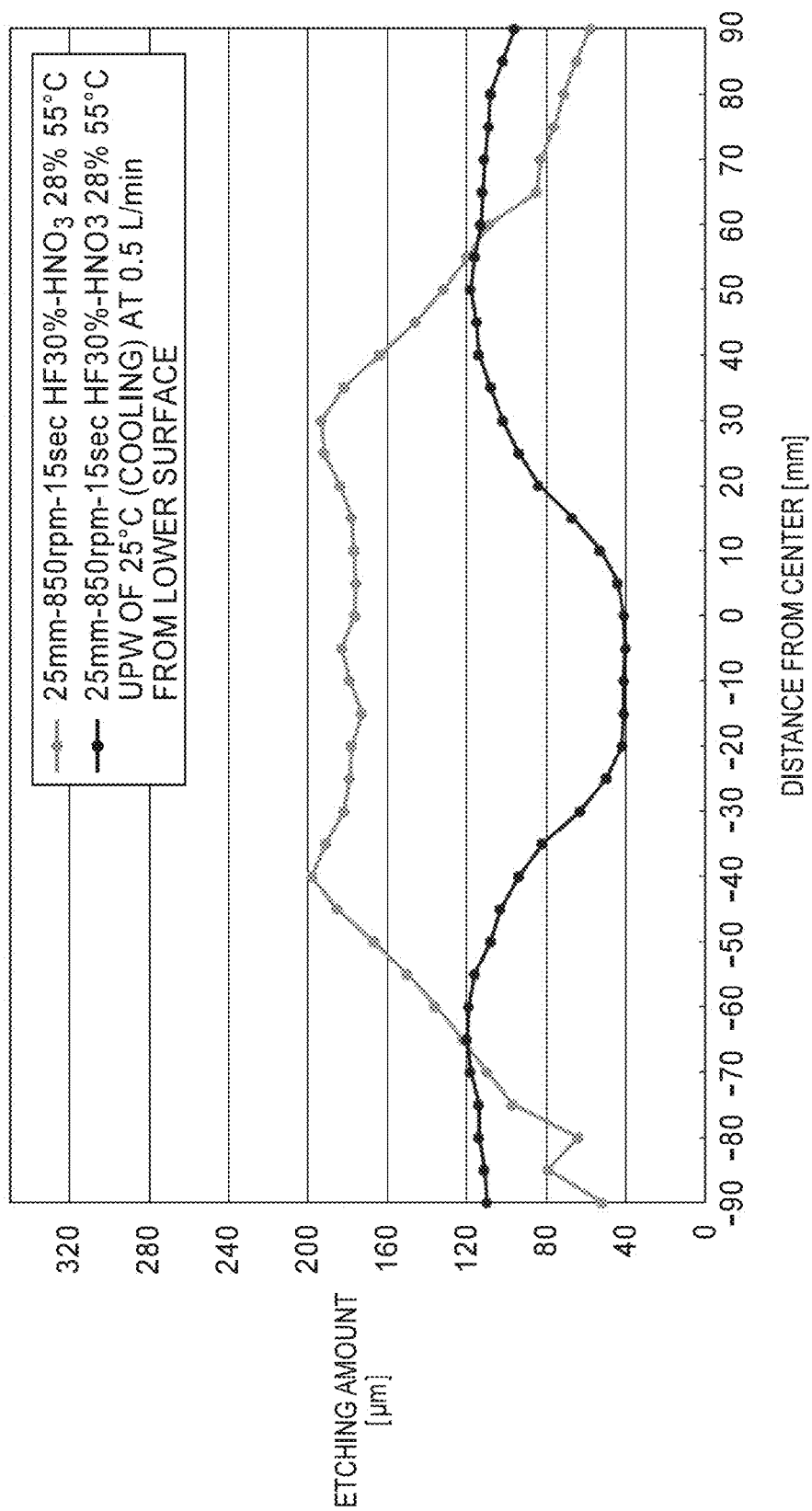
F I G. 14

ETCHING METHOD

This application is a continuation of International Patent Application No. PCT/JP2012/004556 filed on Jul. 13, 2012, the entire content of which is incorporated herein by reference

BACKGROUND OF THE INVENTION

1. Field of the Invention

The present invention generally relates to an etching method and especially to an etching method of etching the upper surface of a silicon wafer or the like using an etching solution.

2. Description of the Related Art

A semiconductor apparatus using an SOI (Silicon on Insulator) substrate is generally advantageous in energy-saving and operation speed, as compared with a semiconductor apparatus using an Si substrate such as a silicon (Si) wafer. For example, in the area of a photoelectric conversion apparatus such as an image sensor, it has been proposed to use an SOI substrate.

On the other hand, along with an increase in number of opportunities to capture an image or observe an object at a high definition and high resolution, high-density image sensors are increasingly proposed/developed year by year. In a high-density image sensor, photoelectric conversion elements such as photodiodes are arrayed at high density to form a photoelectric conversion unit. As the density is higher, the area of the light-receiving surface (pixel) of the photoelectric conversion element has to become smaller. As the area of the light-receiving surface becomes smaller, an amount of light entering the photoelectric conversion element per unit time also becomes smaller and thus it is necessary to improve the light sensitivity of the photoelectric conversion element. However, improvement of the light sensitivity has limitations.

Furthermore, one of large factors which decrease the area of the light-receiving surface more than necessary along with an increase in density is an area occupied by wiring for transmitting a signal to each photoelectric conversion element or driving element, and applying a predetermined voltage to a predetermined position of the image sensor. In general, wiring is designed to have a wide width as much as possible to keep its resistance low for the convenience of manufacturing. For this reason, the ratio of an area occupied by wiring of a light-receiving unit including a plurality of two-dimensionally arrayed light-receiving surfaces increases as the density of the arrayed light-receiving surfaces is higher. To avoid this situation, it has been proposed and put into practical use to decrease the resistance by increasing the thickness of the wiring instead of its width. However, it causes an increase in number of manufacturing processes, resulting in an increase in cost.

In recent years, as a method of increasing the density and improving the light sensitivity, a number of so-called back-side illumination image sensors which cause light to enter in a direction (from the lower surface of an Si substrate) opposite to the incident direction to the photoelectric conversion unit of a general image sensor have been proposed since it is possible to reduce the influence of the wiring area, and some of the image sensors have been put into practical use. In this type of image sensors, a first substrate in which a photoelectric conversion unit is provided and a second substrate in which a driving circuit is provided on an SOI substrate are bonded so that a surface of the first substrate opposite to that on which the photoelectric conversion unit is provided faces a surface of the second substrate on which the driving circuit is provided.

Since, however, light enters the photoelectric conversion elements through the Si substrate, it is required to provide a measure for allowing light beams of respective colors (wavelengths) to efficiently enter the light-receiving surfaces of corresponding photoelectric conversion elements, respectively.

There is proposed one method of removing the lower surface of the Si substrate by CMP (Chemical Mechanical Polishing) or wet etching, so that the Si substrate becomes as thin as possible. However, since the Si substrate is relatively thick, it is conventionally ground by CMP to a predetermined thickness, and then undergoes wet etching to remove a so-called damage layer due to CMP. This requires a long time, and rate-determines the production efficiency, resulting in an increase in cost.

Meanwhile, fluonitric acid is well known as an etching solution for wet etching of an Si substrate. Since fluonitric acid is a strong acid, there are constraints on containers for transportation and storage, and the materials of a container and pipe in use, and thus the use of fluonitric acid is often limited. Therefore, fluonitric acid is actually used at a low acid concentration at a production site, which is a hindrance to shortening of an etching time to improve the productivity.

On the other hand, Yoshikawa et al. "Silicon Wafer Thinning Technology for Three-Dimensional Integrated Circuit by Wet Etching", IEICE Technical Report 2009 (NPL 1) describes high-concentration fluonitric acid. The fluonitric acid described in NPL 1 has a performance of a high etching rate of 800 μm/min for an Si wafer (FIG. 19). The use of such fluonitric acid is expected to significantly improve the production efficiency of, for example, a back-side illumination image sensor.

SUMMARY OF INVENTION

According to an embodiment, an etching method comprises: measuring a temperature at a plurality of predetermined positions on an upper surface of an Si substrate during the etching processing, wherein the etching processing comprises supplying an etching solution to the upper surface of the Si substrate, and an exothermic reaction occurs in the etching processing; and heating or cooling the upper surface depending on the measured value.

According to another embodiment, an etching method comprises: measuring a temperature at a plurality of predetermined positions on an upper surface of an Si substrate during an etching processing which comprises supplying a fluonitric acid solution to the upper surface of the Si substrate; and heating or cooling the upper surface depending on the measured value.

According to still another embodiment, an etching method comprises: measuring a temperature at a plurality of predetermined positions on an upper surface of an Si substrate in a process of performing an etching processing for the upper surface of the Si substrate by supplying a fluonitric acid solution having a chemical composition of HF (a)-$HNO_3$ (b)-$H_2O$ (c) (a+b+c=100 and a+b≥50 where a, b, and c are numerical values each representing a concentration, and the unit of a, b, and c is wt %); and heating or cooling the upper surface in accordance with the measured value.

Other features and advantages of the present invention will be apparent from the following descriptions taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

BRIEF DESCRIPTION OF THE DRAWINGS

FIG. 12 is a graph for explaining still another example of the position dependence of the etching amount obtained in the experiment;

FIG. 14 is a graph for explaining an example of the position dependence of an etching amount obtained in an experiment;

DESCRIPTION OF THE EMBODIMENTS

Figure 1:
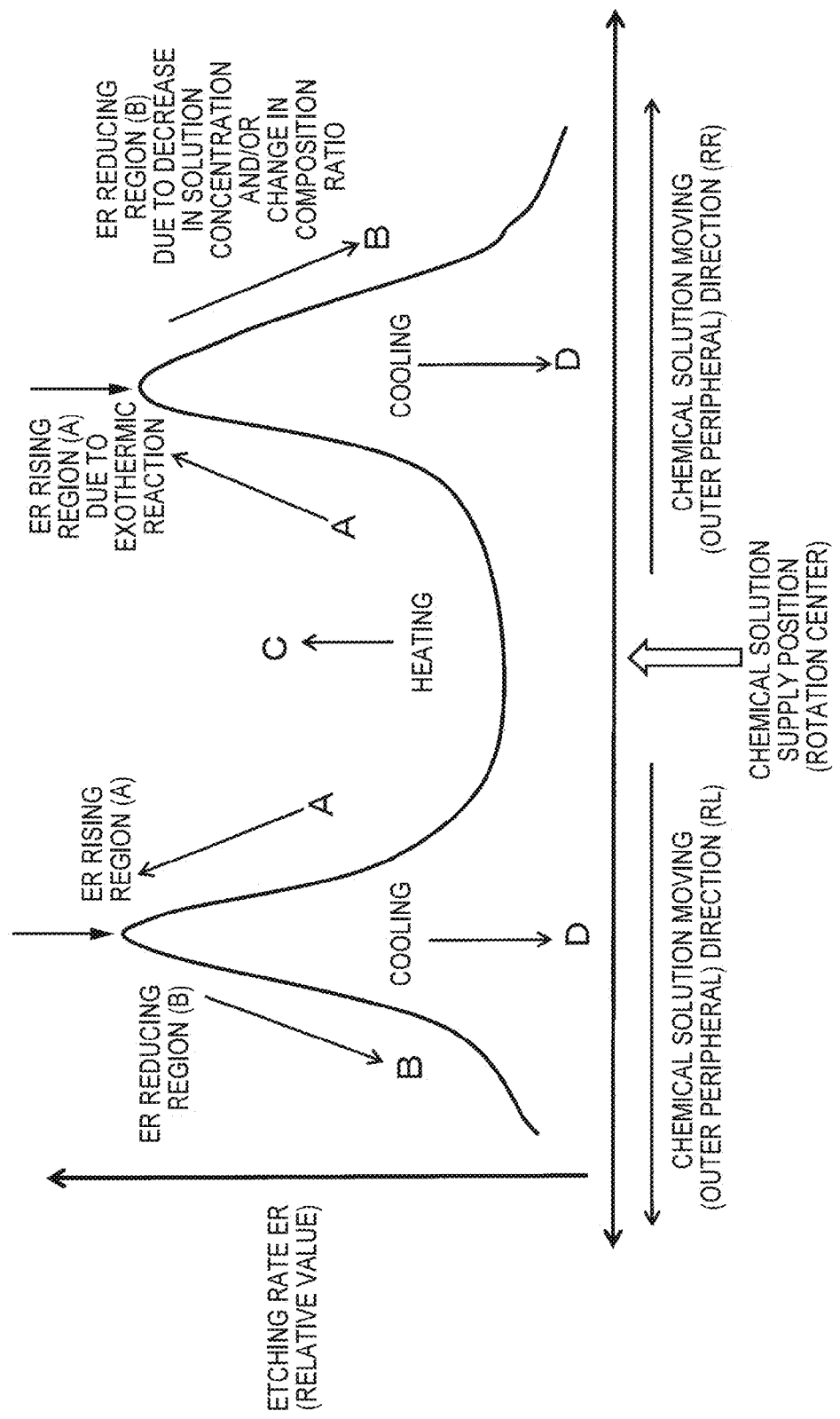
FIG. 1 is a schematic diagram for explaining a typical example of the relationship between an etching rate and the flow position of an etching chemical solution on an Si substrate according to an embodiment.

The inventors of the present application confirmed the following problems as a result of conducting a further experiment for the technique described in NLP 1.

That is, firstly, when the lower surface of the Si substrate was etched using the fluonitric acid described in NLP 1 to form, in part of the Si substrate, a light incident surface which guides external light to the photoelectric conversion unit, random unevenness was formed on the surface of the incident surface to cause scattering and irregular reflection of incident light, resulting in difficulty in efficiently collecting external light into the photoelectric conversion unit. It was confirmed that as the etching rate was raised by adjusting the concentrations of hydrogen fluoride and nitric acid, the magnitude of the random unevenness formed on the surface of the incident surface tended to increase and its distribution tended to widen.

Secondly, when the surface of the Si wafer (substrate) having a diameter as large as 200 to 300 mm was etched, undulating unevenness was formed in addition to the above-described random fine unevenness in some cases. It was thus confirmed that a problem to be solved still existed before the technique can be put into practical use for high productivity.

To solve these problems, the inventors of the present application have carried out dedicated research to find a method of forming an Si substrate having a surface with high smoothness and flatness while taking advantage of a high etching rate of high-concentration fluonitric acid.

As a result, the inventors of the present application found that high-concentration fluonitric acid with an acid concentration falling within a given range had a high etching rate for an Si substrate, and had almost no etching performance or a significantly low etching performance for an $SiO_2$ film, such that the $SiO_2$ film underwent substantially no etching within a time during which etching of the Si substrate was completed.

It was also confirmed that although it was impossible to etch a silicon oxide ($SiO_2$) film having a stoichiometric composition ratio by neutral hydrogen fluoride (HF) molecules, it was possible to etch, by neutral hydrogen fluoride (HF) molecules, a silicon oxide film formed on the Si surface by an etching reaction with the nitric acid in the high-concentration fluonitric acid because the silicon oxide film was made of silicon oxide ($SiO_2$), having oxygen deficiency.

A silicon oxide ($SiO_2$) film having a stoichiometric composition ratio could be etched by bifluoride ions ($HF_2^-$). However, due to the partial dissociation of hydrogen fluoride, the concentration of bifluoride ions ($HF_2^-$) was about $\frac{1}{1000}$ of the concentration of neutral hydrogen fluoride (HF) molecules. Therefore, only a very small number of bifluoride ions ($HF_2^-$) existed in a dissociation equilibrium state of hydrogen fluoride, and thus it was confirmed that etching of the silicon oxide ($SiO_2$) film having a stoichiometric composition ratio by bifluoride ions ($HF_2^-$) advanced by only a small amount which could be ignored, as compared with etching of the Si substrate by fluonitric acid.

An especially important one of a lot of findings obtained in the process of dedicated research is that the etching reaction when etching the surface of the Si substrate by fluonitric acid is an exothermic reaction, and the temperature of a high-concentration fluonitric acid etching solution used for etching may rise to as high as 100° C. and the etching rate depends on the rising temperature. As will be described later with reference to experiments, when the exothermic reaction increases the area of the etched surface of an etched member, spiral undulating unevenness may be generated in the outer peripheral direction from an etching solution supply position in addition to the above-described fine evenness. The undulating unevenness can be observed more remarkably as the area of the etched surface increases.

There is provided an Si substrate etching method capable of performing etching at high speed while keeping a surface state with very high smoothness and flatness over a large area, by using the techniques and findings.

According to an etching method of some embodiments, firstly, it is possible to provide an Si substrate having a surface with high smoothness and flatness.

Secondly, it is possible to provide an Si substrate having a surface with high smoothness and flatness for a photoelectric conversion module having a light incident surface which can efficiently, externally guide light to a photoelectric conversion unit.

Thirdly, it is possible to provide an Si substrate having a surface with high smoothness and flatness for a back-side illumination image sensor with significantly improved production efficiency.

Other features and advantages of embodiments will be apparent from the following descriptions taken in conjunction with the accompanying drawings, in which like reference characters designate the same or similar parts throughout the figures thereof.

The embodiments are based on the fact that the present inventors found, by repeatedly, carefully observing an etching state in a repeatedly performed experiment, that formation of undulating unevenness was associated with the supply position, supply amount, and flow direction of an etching solution, and the surface temperature of an etched surface had significant position dependence.

The main technical requirements of an embodiment will be explained first with reference to FIGS. 1 and 2. FIG. 1 is a schematic diagram for explaining a typical example of the relationship between an etching rate ER and the flow position of an etching chemical solution on an Si substrate according to the present embodiment.

Figure 2:
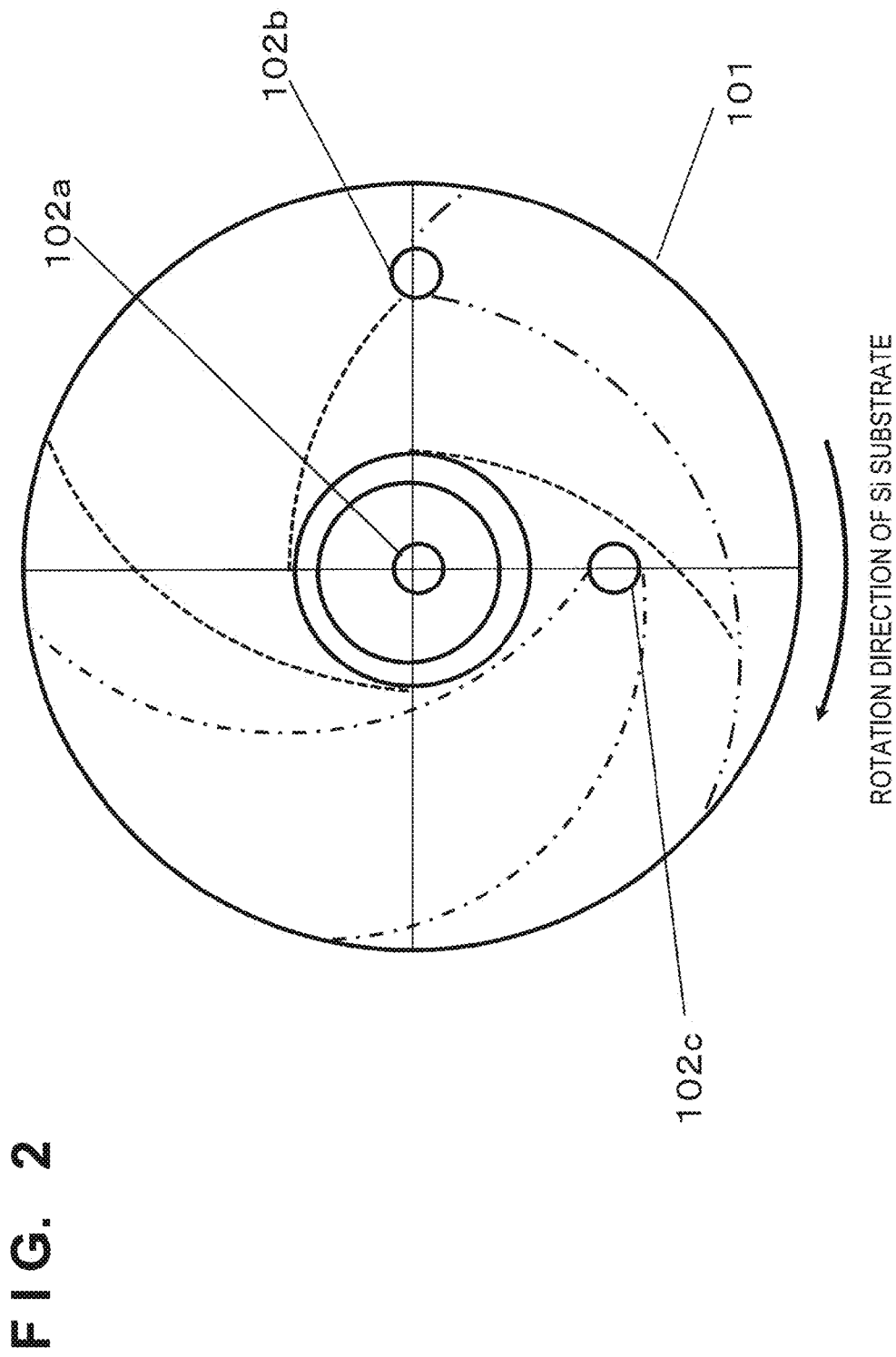
FIG. 2 is a schematic view for explaining an example of the relationship between the fluidity of the etching chemical solution and the discharge direction of the etching chemical solution discharged from a solution supply nozzle for supplying the etching solution to the etched surface of the Si substrate.

FIG. 2 is a schematic view for explaining a typical example in which etching is performed while supplying a fluonitric acid etching solution at a predetermined flow rate from an etching solution supply nozzle set at a predetermined position to the surface of a silicon (Si) wafer (substrate) for a semiconductor having a diameter of about 6 to 10 inch, which rotates at a predetermined fixed rotation speed, and shows an Si substrate 101 when viewed from above.

FIG. 1 shows a case in which the upper surface of the Si substrate 101 is etched while supplying the etching solution from only an etching solution supply nozzle 102a shown in FIG. 2.

Referring to FIG. 1, the abscissa represents the diameter direction of the Si substrate 101 and the ordinate represents a relative etching rate (ER) at a predetermined position on the upper surface of the Si substrate 101. A region (a fixed ER region: the bottom center portion of the graph shown in FIG. 1) up to a given distance from the rotation center position of the Si substrate 101 (the solution supply position of the nozzle 102a) in the outer peripheral direction of the Si substrate 101 has an etching rate (ER) almost equal to that at the rotation center position. After passing through the region, there exists an ER rising region (A) where the etching rate (ER) reaches its peak at a position X. It is understood from FIG. 1 that after passing through the peak position X, there exists an ER reducing region (B), and the decrease in etching rate (ER) becomes moderate near the outer peripheral edge of the Si substrate 101. These etching rate regions, their curve shapes, peak ER, peak position X, and the like depend on the rotation speed of the substrate having an etched surface, the supply amount of the etching solution per unit time, the composition, viscosity and surface tension of the etching solution, the number, arrangement positions, orifice shape and discharge directions of the nozzles 102, and the like.

Each of three etching solution supply nozzles 102a, 102b, and 102c drops and supplies the etching solution to the etched processing surface of the Si substrate 101. The etching solution supplied from each nozzle is adjusted to a predetermined temperature and then supplied. The Si substrate 101 rotates at a desired rotation rate, as indicated by an arrow. The etching solution is supplied to the etched processing surface of the Si substrate 101 while rotating the Si substrate 101 at a fixed speed. The position of the nozzle 102a coincides with the rotation center position of the Si substrate 101.

The etching solution dropped and supplied from each nozzle to the etched processing surface of the Si substrate 101 flows in the outer peripheral direction of the Si substrate 101 while drawing a spiral or arc-shaped locus in accordance with the rotation speed of the Si substrate 101, as indicated by broken lines, one-dot dashed lines, and two-dot dashed lines in FIG. 2. The locus of flow of the etching solution becomes closer to a straight line as the rotation speed of the Si substrate 101 increases.

When the discharge direction of solution supply is set to be opposite to the rotation direction of the substrate, a solution layer on the rotating substrate swells in a portion where the supplied solution contacts the solution layer, thereby interfering with stable flow of the solution on the substrate. Since this interference may locally change the etching rate, it may be undesirable to set the discharge direction of solution supply to be opposite to the rotation direction of the substrate. The degree of the interference depends on the rotation speed of the substrate and the discharge speed/discharge angle of the solution. For this reason, it is desirable to select the rotation speed of the substrate and the discharge speed/discharge angle of the solution so that the influence of the interference causes substantially no local change in etching rate. It is particularly preferable to set the discharge direction to be parallel to the rotation direction of the substrate.

It is preferable to set the solution discharge direction from the orifice of the nozzle 102b to a direction indicated by an arrow b at an angle $\theta$ with respect to the X-axis since interference with flow of the etching solution on the upper surface of the substrate 101 can be reduced to a minimum. It is desirable that the angle $\theta$ preferably falls within the range of $0°<\theta<90°$, and more preferably falls within the range of $10°\leq\theta\leq45°$. The solution discharge direction from the orifice of the nozzle 102b is set to a predetermined direction while keeping an angle $\phi$ with respect to the Z-axis in terms of the relationship with a rotation center axis Z and keeping the angle $\theta$ with respect to the X-axis in terms of the relationship on the X-Y plane. The angle $\phi$ is set to an appropriate value in terms of the relationship with the angle $\theta$, the shape and size of the nozzle 102, the shape, size, and number of the orifices of the nozzle 102, and the rotation speed of the substrate 101 so as to effectively achieve the object of the present invention.

Figure 3A:
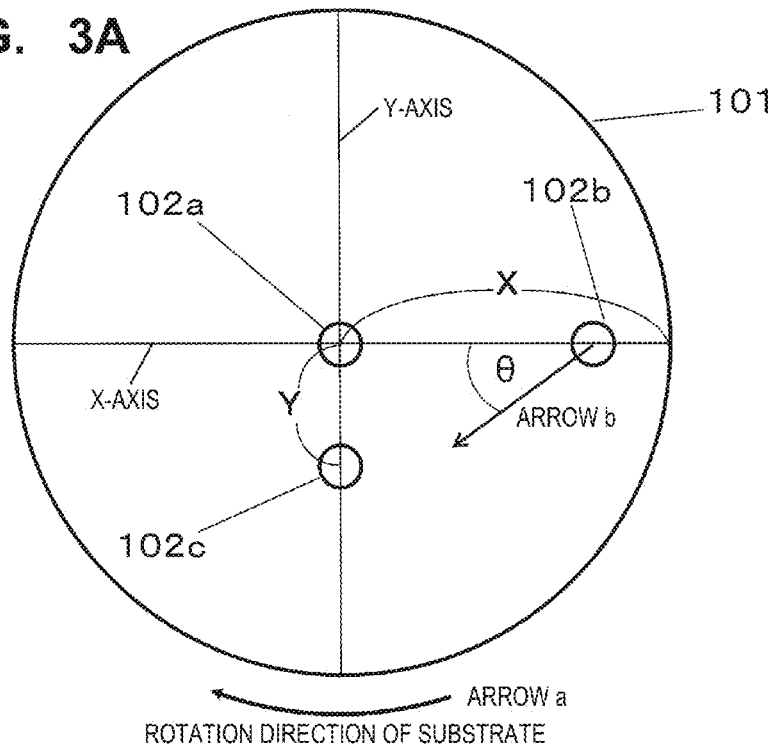
FIG. 3A is a schematic view for explaining an example of the relationship between the etched surface of the Si substrate and the solution supply direction from the solution supply nozzle for supplying the etching solution to the etched surface.
Figure 3B:
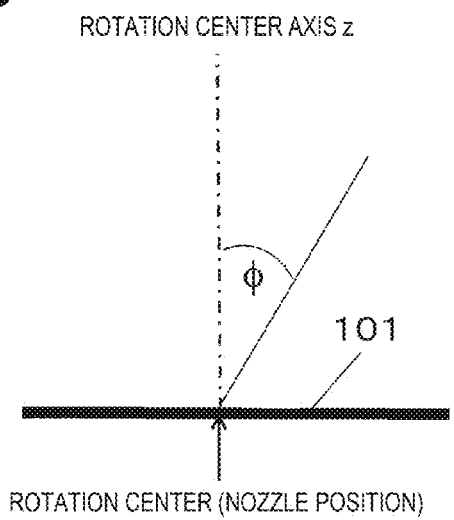
FIG. 3B is a schematic view for explaining an example of the relationship between the etched surface of the Si substrate and the solution supply direction from the solution supply nozzle for supplying the etching solution to the etched surface.

FIGS. 3A and 3B are schematic views for explaining the positional relationship between the respective nozzles, solution discharge directions from the nozzles (the orientations of the nozzles), and the like when performing etching by arranging the three nozzles at predetermined positions, similarly to the case shown in FIG. 2.

Referring to FIGS. 3A and 3B, the three nozzles are arranged above the Si substrate 101 at a predetermined distance from the etched surface (upper surface) of the Si substrate 101. That is, the nozzle 102a is arranged at a position which coincides with the rotation center of the Si substrate 101, the nozzle 102b is arranged at a position on the X-axis, and the nozzle 102c is arranged at a position on the Y-axis. The nozzles 102a and 102b are arranged to have a distance X between them. The nozzles 102a and 102c are arranged to have a distance Y between them.

In the simplest arrangement, the etching (chemical) solution discharge directions from the three nozzles 102 toward the substrate 101 are set to be perpendicular to the upper surface of the substrate 101. In this case, an appropriate solution supply amount per unit time from each of the three nozzles 102 is determined in consideration of the rotation speed and size of the substrate 101. If the size of the substrate 101 is not so large, it may be possible to appropriately supply the solution using only the nozzle 102a.

The distances X and Y depend on the shapes and sizes of the nozzles 102 and the shapes, sizes, and number of orifices of each nozzle 102, and are designed to effectively achieve the object of the present invention. The shape and orifice structure, the solution discharge force, and the discharge direction of each nozzle influence the fluidity of the etching solution on the substrate. When the degree of the influence exceeds a certain degree, the etching rate may change. It is, therefore, desirable to appropriately select the shape and orifice structure, the solution discharge strength, and the discharge direction of each nozzle so as to achieve the object of the present invention.

Although the shape of each nozzle may be linear, tapered narrower to the end, or tapered wider to the end, it is preferably tapered narrower to the end since it then becomes possible to readily obtain more correct discharge directivity. The nozzle array may be a single-row array, multi-row array, or concentric circle array as long as it is designed to achieve the object of the present invention. Furthermore, a method of discharging an etching chemical solution from a plurality of nozzles may be of a divergent type like a so-called shower head, a directional type, or a convergent type. Increasing the discharge pressure by decreasing the orifice area of the nozzle is also effective to improve the directivity of the solution supply direction.

A chemical solution may be supplied to the etched surface of the Si substrate by a pressure-feeding method, pressurization method, gravity drop method, vertical discharge supply method, pressurized drop method, or inclination discharge method.

It is desirable that the angle φ preferably falls within the range of $90° \geq \phi > 0°$, and more preferably falls within the range of $60° \geq \phi \geq 10°$.

The etching rate largely depends on the concentration of a chemical constituent material of the etching solution, which determines the degree of the exothermic reaction occurring in etching. The present embodiment prevents a big temperature difference shown in the typical example of FIG. 1 in the temperature distribution of the etched surface of the substrate undergoing etching processing.

In the present embodiment, even if fluonitric acid generally used and having a general stoichiometric composition ratio and concentration is used, it is possible to obviously obtain the effect of the present embodiment. However, fluonitric acid having the following stoichiometric composition ratio and concentration is preferably used from the technical viewpoint of high mass productivity such that the etching rate is significantly high and the effect of the present embodiment is dramatic.

That is, the values of a, b, and c of the expression presented earlier are selected to obtain a desired etching rate at which it is possible to manufacture a target Si substrate with high productive efficiency, as needed.

According to the present embodiment, in general, the values of a, b, and c desirably fall within the ranges of $19 \leq a \leq 42$, $11 \leq b \leq 60$, and $28 \leq c \leq 45$, respectively, where $a+b+c=100$. Under these conditions, it is possible to ensure at least an etching rate of 400 μm/min for the Si substrate.

Preferably, the values desirably fall within the ranges of $23 \leq a \leq 40$, $14 \leq b \leq 52$, and $25 \leq c \leq 46$, respectively, where $a+b+c=100$. Under these conditions, it is possible to ensure at least an etching rate of 600 μm/min for the Si substrate.

More preferably, the values desirably fall within the ranges of $27 \leq a \leq 37$, $18 \leq b \leq 45$, and $28 \leq c \leq 45$, respectively, where $a+b+c=100$. Under these conditions, it is possible to ensure at least an etching rate of 800 μm/min for the Si substrate.

Note that the unit of a, b, and c of the above expressions is wt %.

According to the present embodiment, more preferably, $c \leq a+b$ holds in addition to the above conditions.

According to the present embodiment, as long as the values of a, b and c of HF (a)-$HNO_3$ (b)-$H_2O$ (c) and their relationship are defined as described above, and there is no practical adverse effect on the etching rate, a necessary additive may be added depending on the purpose. Examples of the additive are acetic acid, sulfuric acid, and phosphoric acid.

Experiment 1

Figure 4:
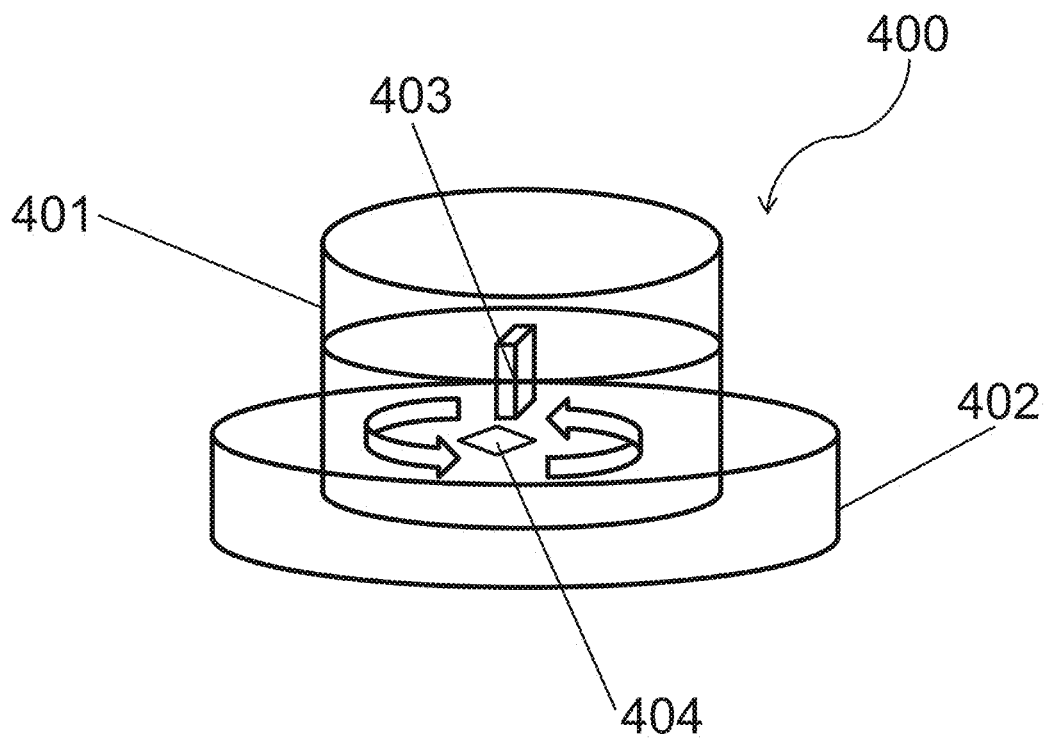
FIG. 4 is a schematic view for explaining a first laboratory apparatus used in Experiment 1.

The temperature dependence of an etching rate was confirmed as follows. FIG. 4 is a schematic view for explaining a first laboratory apparatus 400 used in the experiment. A dipping tank 401 stores fluonitric acid of a predetermined concentration as an etching chemical solution. The dipping tank 401 is arranged in a thermostatic chamber 402 and thus the etching chemical solution in the dipping tank 401 is kept at a predetermined temperature. Furthermore, the dipping tank 401 includes a magnetic stirrer 404 which functions to keep the temperature of the etching chemical solution uniform by being externally applied with a torque to stir the etching chemical solution in the dipping tank 401. A silicon wafer 403 serving as an experimental sample is dipped into the dipping tank 401 prepared as described above, and undergoes an etching action.

Figure 5:
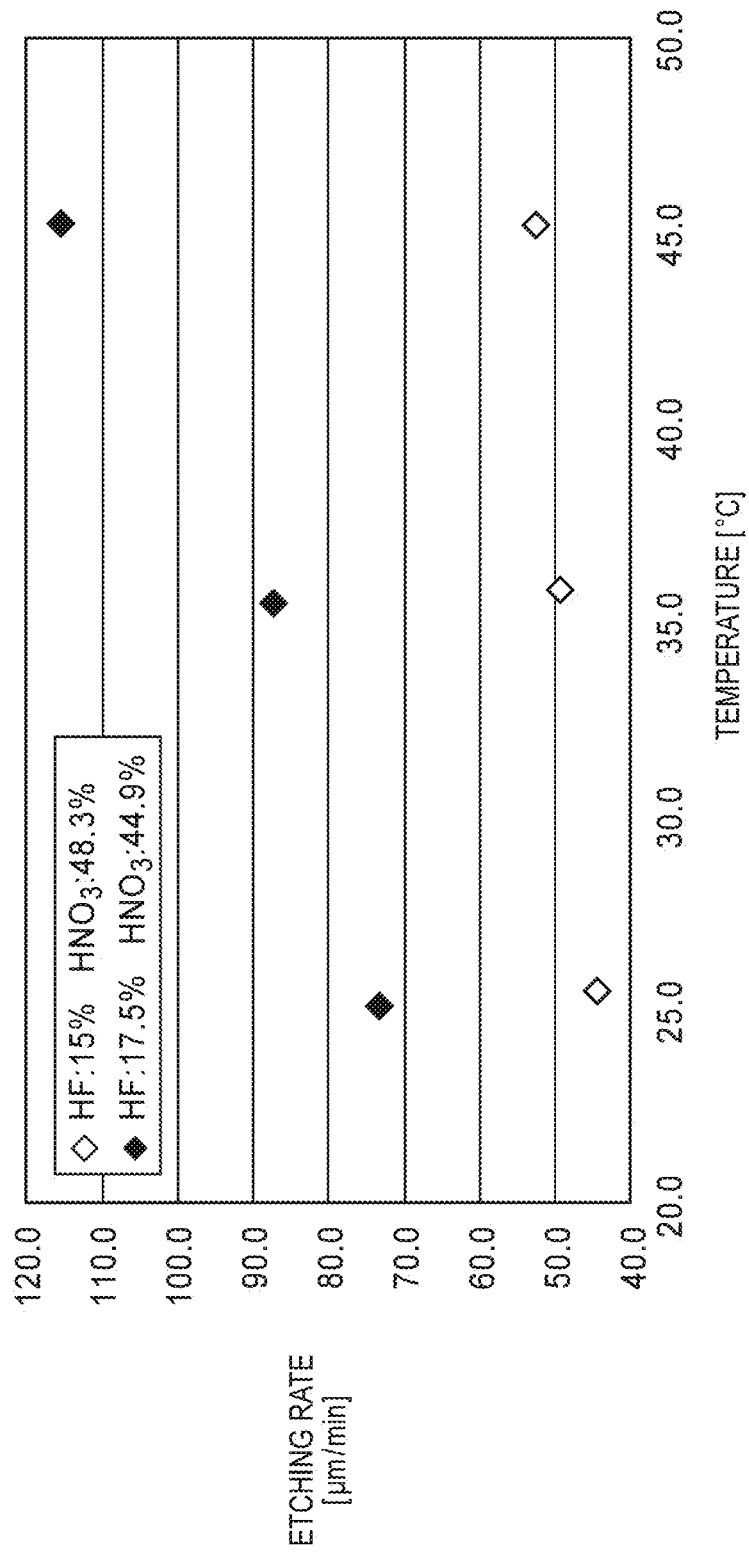
FIG. 5 is a graph for explaining an example of the temperature dependence of the etching rate.

Experimental conditions will be described below.
(1) Preparation of Sample and Chemical Solution
Sample . . . p-type silicon wafer substrate having a side of 30 mm and a thickness of 775 μm
Etching chemical solution . . . fluonitric acid chemical solution of a predetermined concentration (the concentration of $HNO_3$ was adjusted within the range of 4 to 49 wt % and the concentration of HF was adjusted within the range of 13.5 to 47 wt %)
(2) Etching Manner
Etching method . . . dipping method
Etching surface . . . both surfaces
Etching time . . . 20 sec to 1 min
Sample 403 was oscillated in the chemical solution (oscillation cycle: 1.5 sec/reciprocation)
(3) Measurement of Etching Rate
Measurement method . . . micrometer (accuracy: 10 μm)
½ the difference in thickness of the wafer before and after etching FIG. 5 shows the result. It is apparent from FIG. 5 that as the concentration of the etching chemical solution is higher, the temperature dependence of the etching rate is also higher.

Experiment 2

The position dependence of an etching rate on the upper surface of an Si substrate when performing etching while rotating the Si substrate and vertically dropping and supplying an etching chemical solution from the rotation center axis of the Si substrate to the upper surface of the Si substrate was confirmed.

Figure 6:
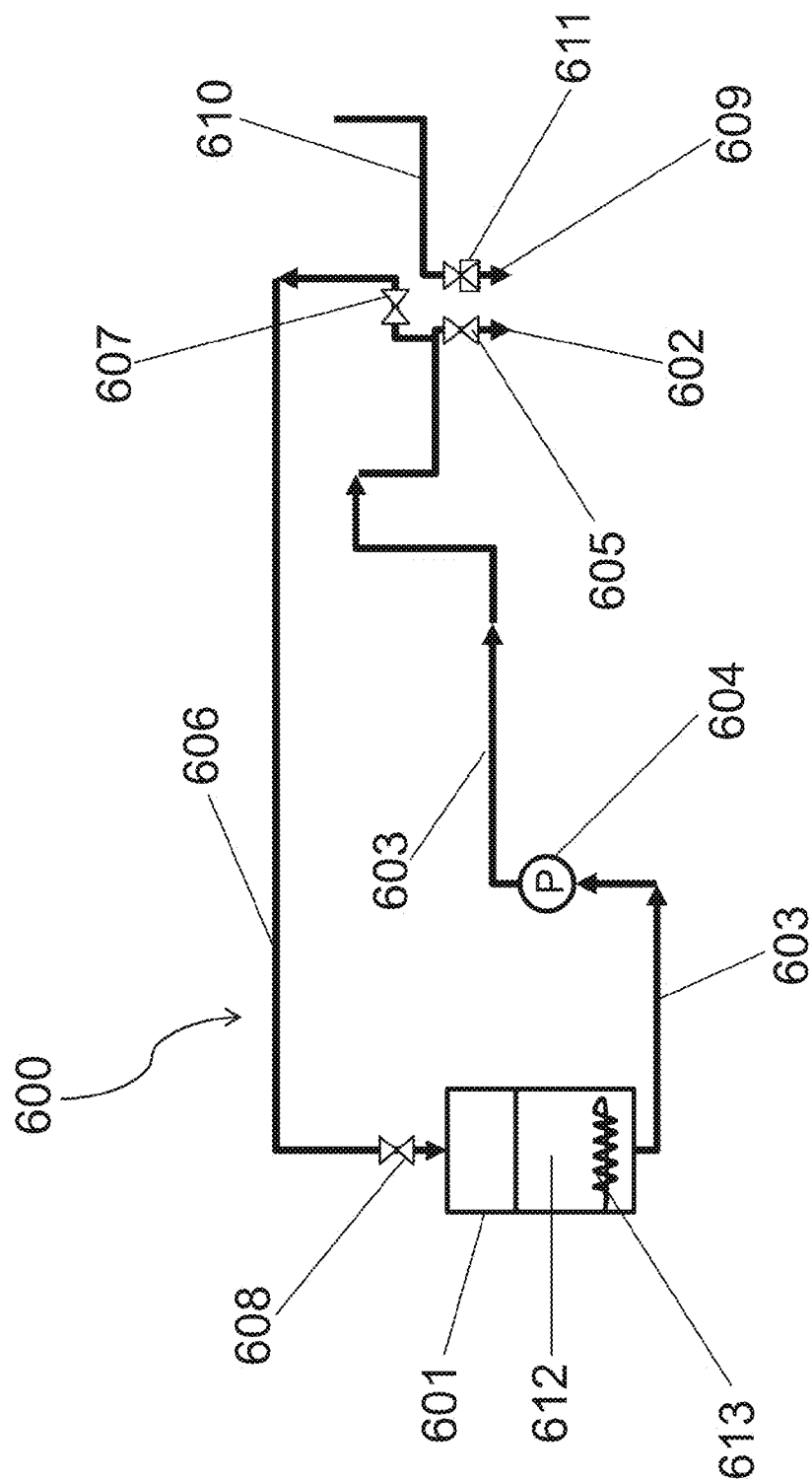
FIG. 6 is a schematic view showing the arrangement of a second laboratory apparatus used in Experiment 2.

FIG. 6 is a schematic view showing a second laboratory apparatus 600 to be used in the experiment. The laboratory apparatus 600 shown in FIG. 6 includes a tank 601 for storing an etching chemical solution, and a nozzle 602, which are connected to each other by a supply line 603 for supplying the chemical solution. A pump 604 for controlling the supply pressure and supply amount of the chemical solution is arranged along the supply line 603. The chemical solution supply amount to the nozzle 602 can also be adjusted by a valve 605.

A return line 606 is connected on the downstream side of the supply line 603 near the nozzle 602. The return line 606 is used to prevent the etching chemical solution from being excessively supplied to the nozzle 602, and is connected to the tank 601 on its downstream side. Valves 607 and 608 arranged midway along the return line 606 can adjust the etching chemical solution amount to be supplied to the nozzle 602 by adjusting the etching chemical solution amount flowing through the return line 606.

A nozzle 609 is used to rinse the upper surface of the Si substrate by ultrapure water or the like, and is connected to a supply line 610 for supplying a rinse solution via a valve 611.

An etching chemical solution 612 in the tank 601 is heated by a heater 613 and supplied to the nozzle 602 at a predetermined temperature.

As shown in FIG. 2, the Si substrate is arranged so that the nozzle 602 is positioned at the rotation center of the substrate, and is supplied with the etching chemical solution 612 from the nozzle 602 while rotating at a fixed speed.

(1) Experimental Conditions

Position of nozzle 602 . . . on the rotation center axis of the substrate above the etched surface of the substrate Etching chemical solution supply amount . . . 1 L/min Rotation speed of sample (p-type Si substrate: 200 mm ϕ) . . . 850 rpm Etching time . . . 15 sec Etching chemical solution . . . fluonitric acid of HF:30%-HNO$_3$:28%

Temperature of upper surface of sample . . . measuring by a thermo camera

Figure 7:
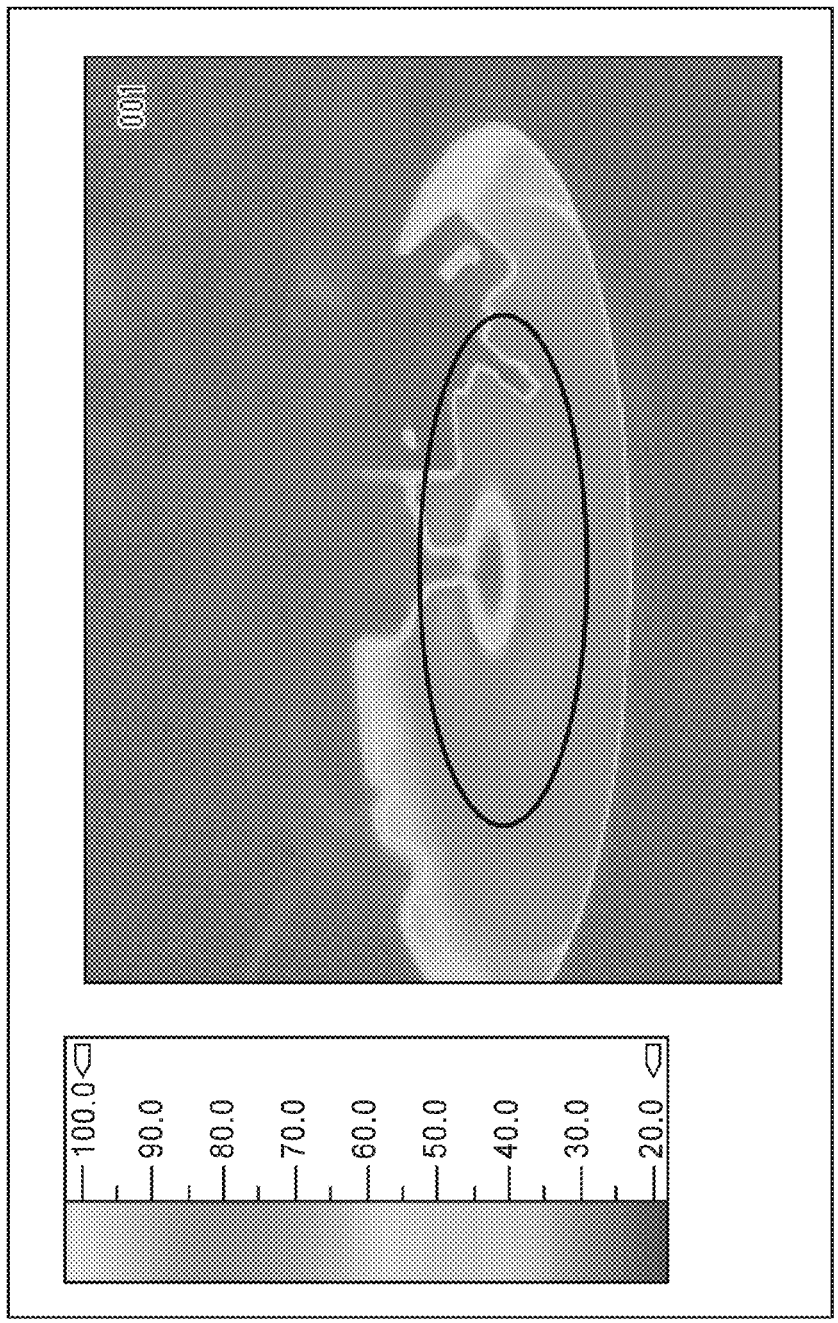
FIG. 7 is a view showing an example of a resultant thermograph obtained in the experiment.
Figure 8:
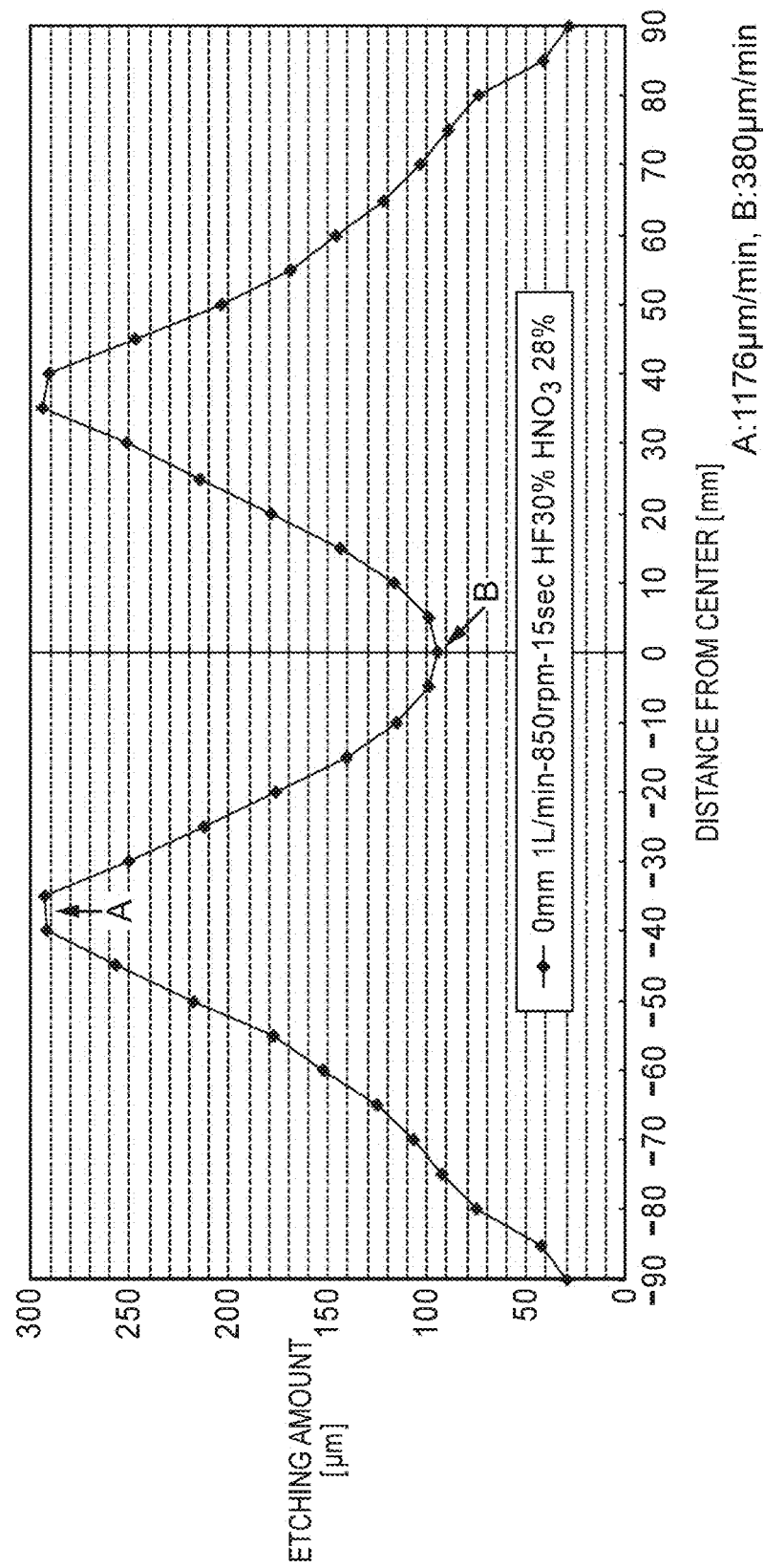
FIG. 8 is a graph for explaining an example of the position dependence of an etching amount obtained in the experiment.

FIGS. 7 to 12 respectively show the results. FIG. 7 shows a thermography measurement result by the thermo camera. FIG. 8 shows the result of measuring the position dependence of the etching amount (first example). Referring to FIG. 8, the etching amount at a peak position A was 1176 μm/min and the etching amount at a position B was 380 μm/min. As is apparent from FIGS. 7 and 8, the etching amount has significant position dependence.

Figure 9:
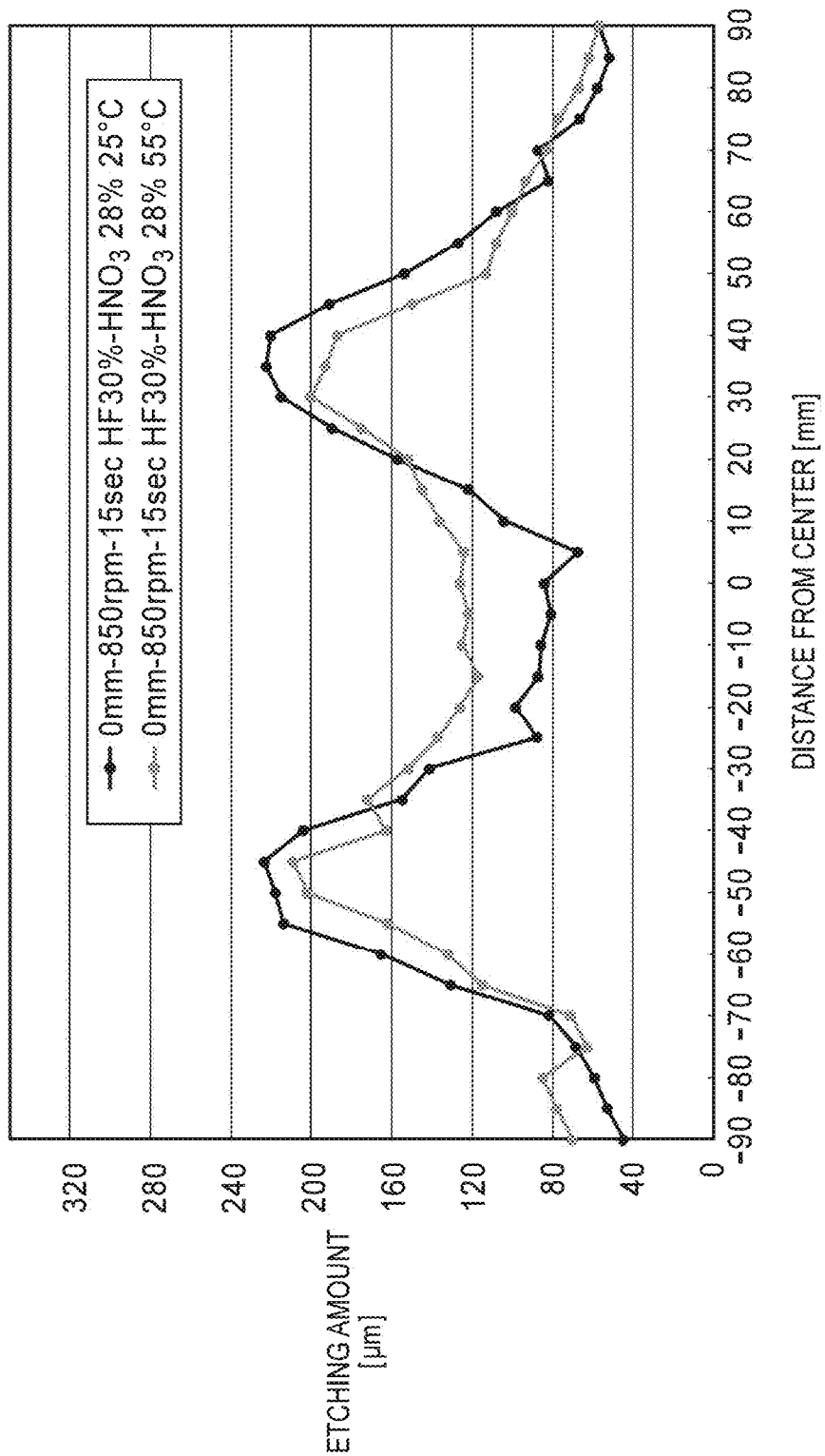
FIG. 9 is a graph for explaining another example of the position dependence of the etching amount obtained in the experiment.

The result shown in FIG. 9 is obtained by performing measurement under the same conditions as those in FIGS. 7 and 8 except that the temperature of the chemical solution is set to 25° C. or 55° C. (second example). It is understood from FIG. 9 that as the temperature of the chemical solution is higher, the position dependence of the etching rate is lower. Therefore, it may be possible to readily obtain a good result by setting the temperature of the chemical solution relatively high.

Figure 10:
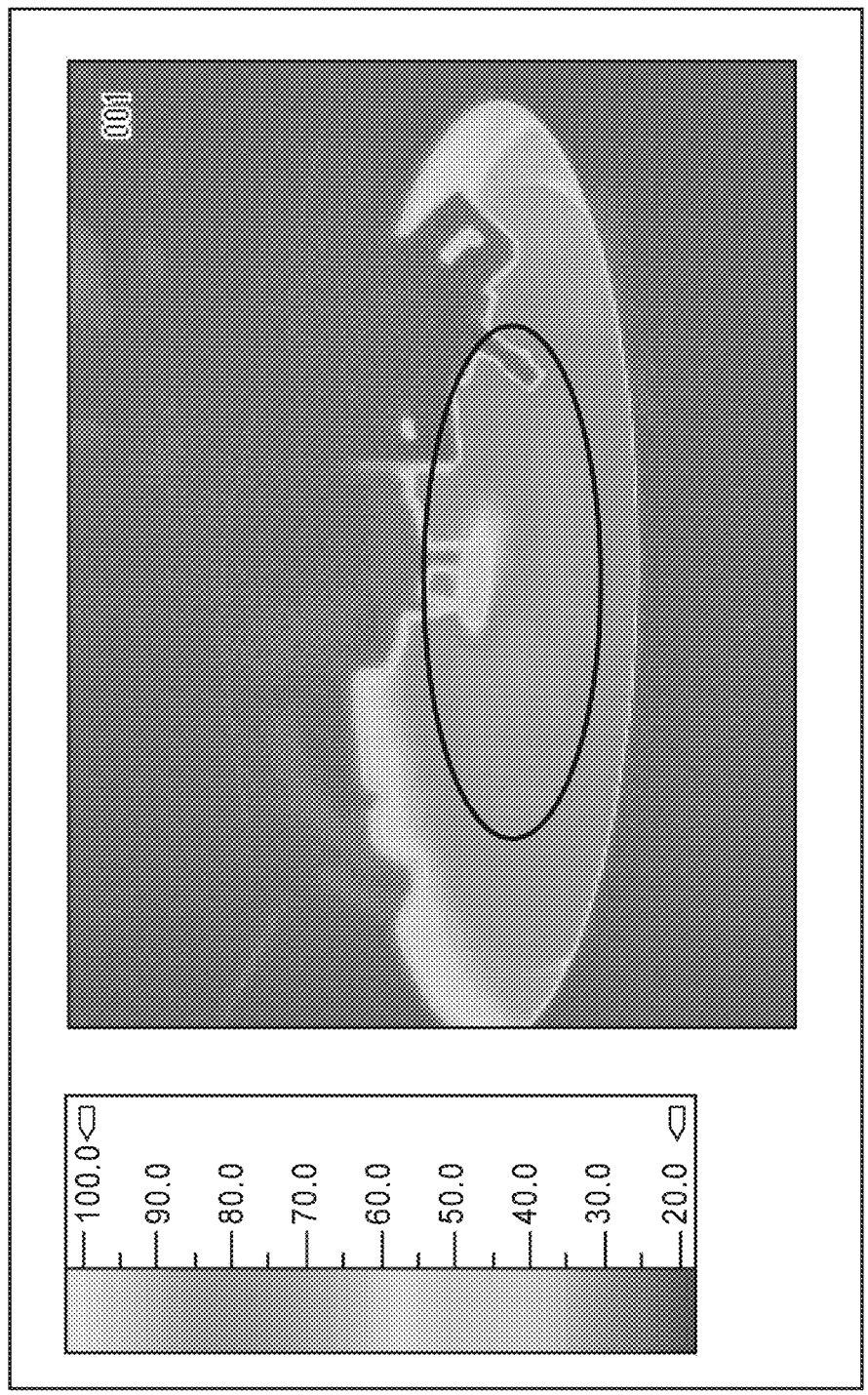
FIG. 10 is a view showing another example of the thermograph obtained in the experiment.
Figure 11:
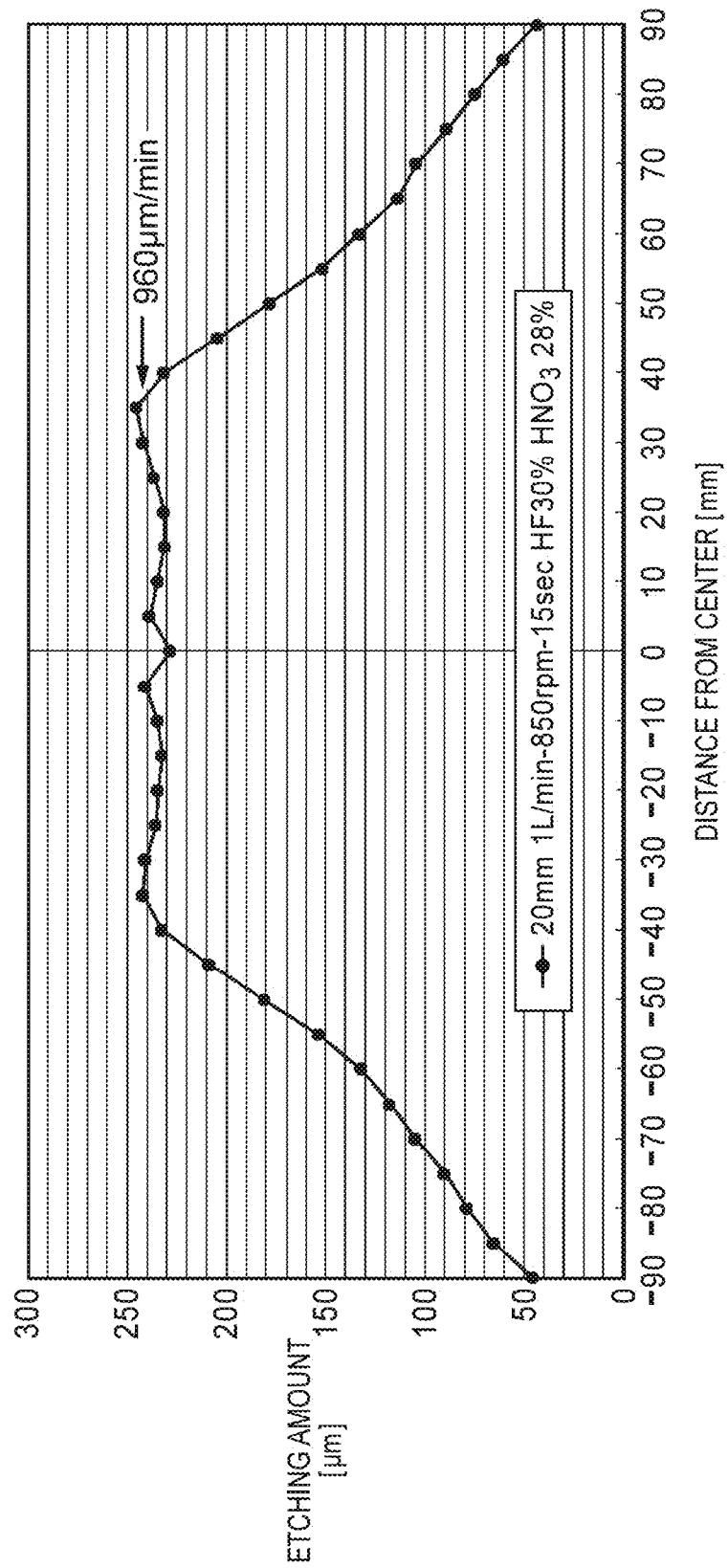
FIG. 11 is a graph for explaining still another example of the position dependence of the etching amount obtained in the experiment.

Each of FIGS. 10 and 11 shows the result obtained under the same conditions as those in the first example except that the position of the nozzle 602 is shifted from the rotation center axis of the substrate by 20 mm to supply the chemical solution. FIG. 10 corresponds to FIG. 7 and FIG. 11 corresponds to FIG. 8. As is apparent from FIG. 11, although the peak of the etching amount is measured on both sides in FIG. 7, the peak as shown in FIG. 7 is hardly measured and the graph of the etching rate has a trapezoidal shape in FIG. 11. Shifting the position of the nozzle 602 from the rotation central position of the substrate to some extent is effective to uniform the etching rate.

FIG. 12 shows the result obtained under the same conditions as those in FIG. 9 in relation to FIG. 8, except that the position of the nozzle 602 is shifted from the rotation center axis of the substrate by 20 mm to supply the chemical solution. It is found that the temperature dependence is lower as the temperature is higher.

Experiment 3

Figure 13:
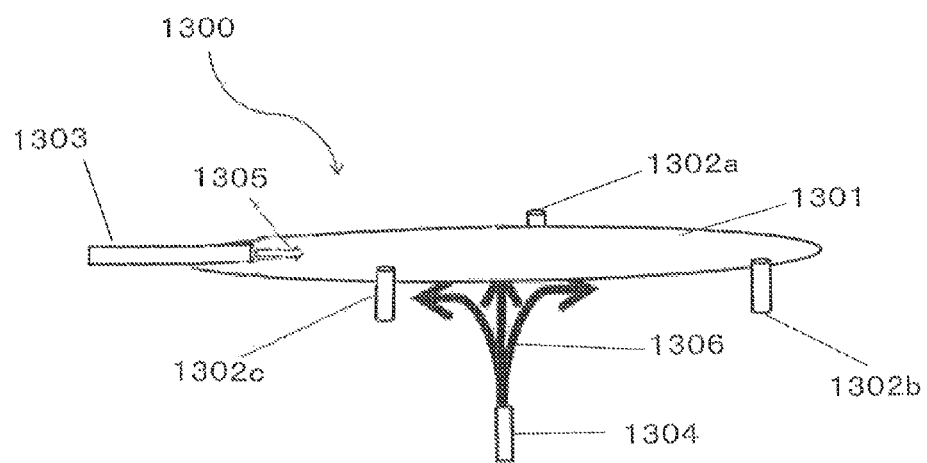
FIG. 13 is a schematic view for explaining the main parts of an etching apparatus according to an embodiment.

An experiment for confirming the effect of cooling was performed. A laboratory apparatus 1300 shown in FIG. 13 is substantially the same as the apparatus 600 shown in FIG. 6 except that a mechanism for cooling an Si substrate is provided.

An Si substrate 1301 is supported by substrate supporting means 1302a, 1302b, and 1302c. A nozzle 1303 supplies an etching chemical solution 1305 to the etched surface of the substrate 1301. A nozzle 1304 discharges a coolant 1306 toward the lower surface of the substrate 1301. The coolant 1306 may be a liquid or gas. Examples of the liquid are cold water and liquid nitrogen. An example of the gas is cooling air. Alternatively, a cooling fan, cooling pump, Peltier device, or the like may be used.

The experimental conditions are the same as those in the above-described example except that fluonitric acid similar to that in the above example but kept at 55° C. is used, substrate cooling from the lower surface is performed or not performed, and the nozzle 1303 is shifted from the rotation center axis of the substrate by 25 mm.

Cooling condition . . . discharge ultrapure water of 25° C. from the nozzle 1304 at a supply amount of 0.5 L/min toward the lower surface of the substrate 1301 to cool it FIG. 14 shows the result. As is apparent from a graph shown in FIG. 14, the cooling effect is obvious.

Experiment 4

Figure 15:
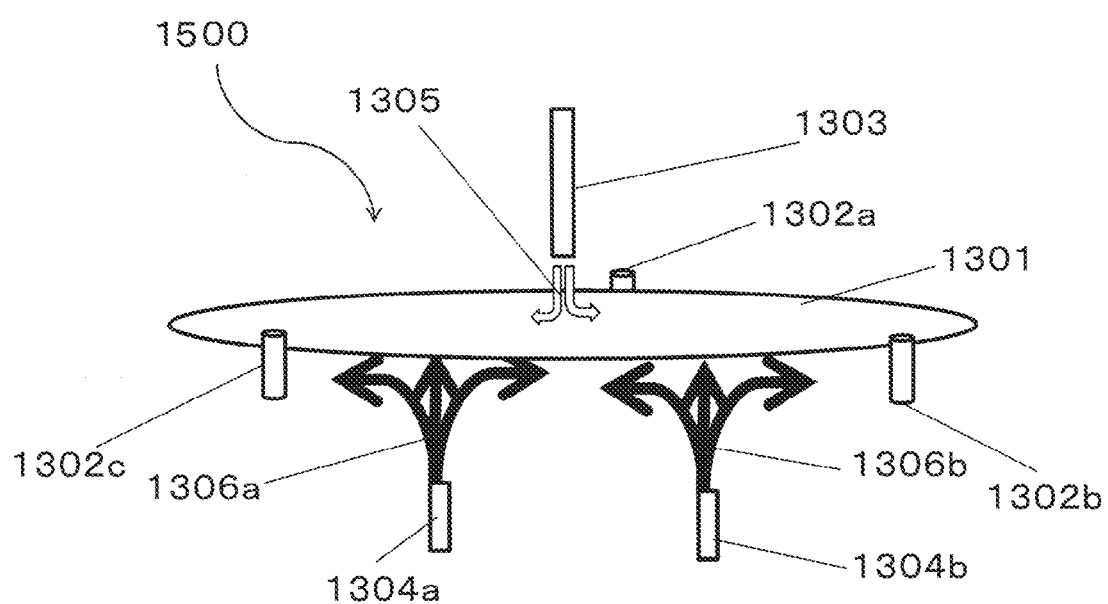
FIG. 15 is a schematic view for explaining the main parts of another etching apparatus according to an embodiment.

A cooling effect was confirmed by providing a plurality of cooling mechanisms. An apparatus 1500 shown in FIG. 15 is the same as the apparatus 1300 shown in FIG. 13 except that two cooling mechanisms are provided.

Figure 16:
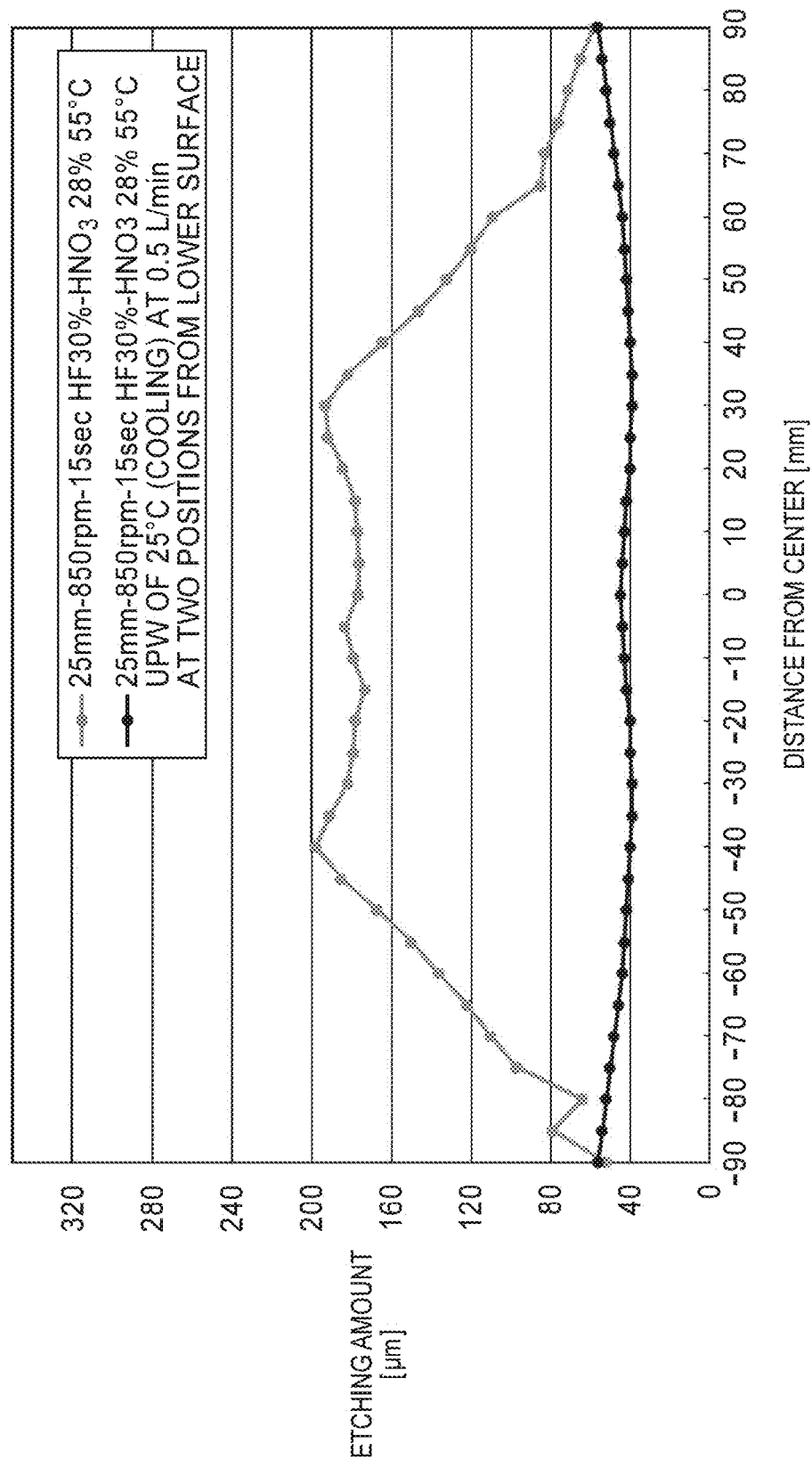
FIG. 16 is a graph for explaining an example of the position dependence of an etching amount obtained in an experiment.

FIG. 16 shows the result. It was confirmed that it was possible to obtain the cooling effect better than the result shown in FIG. 14.

Exemplary Embodiment

Figure 17:
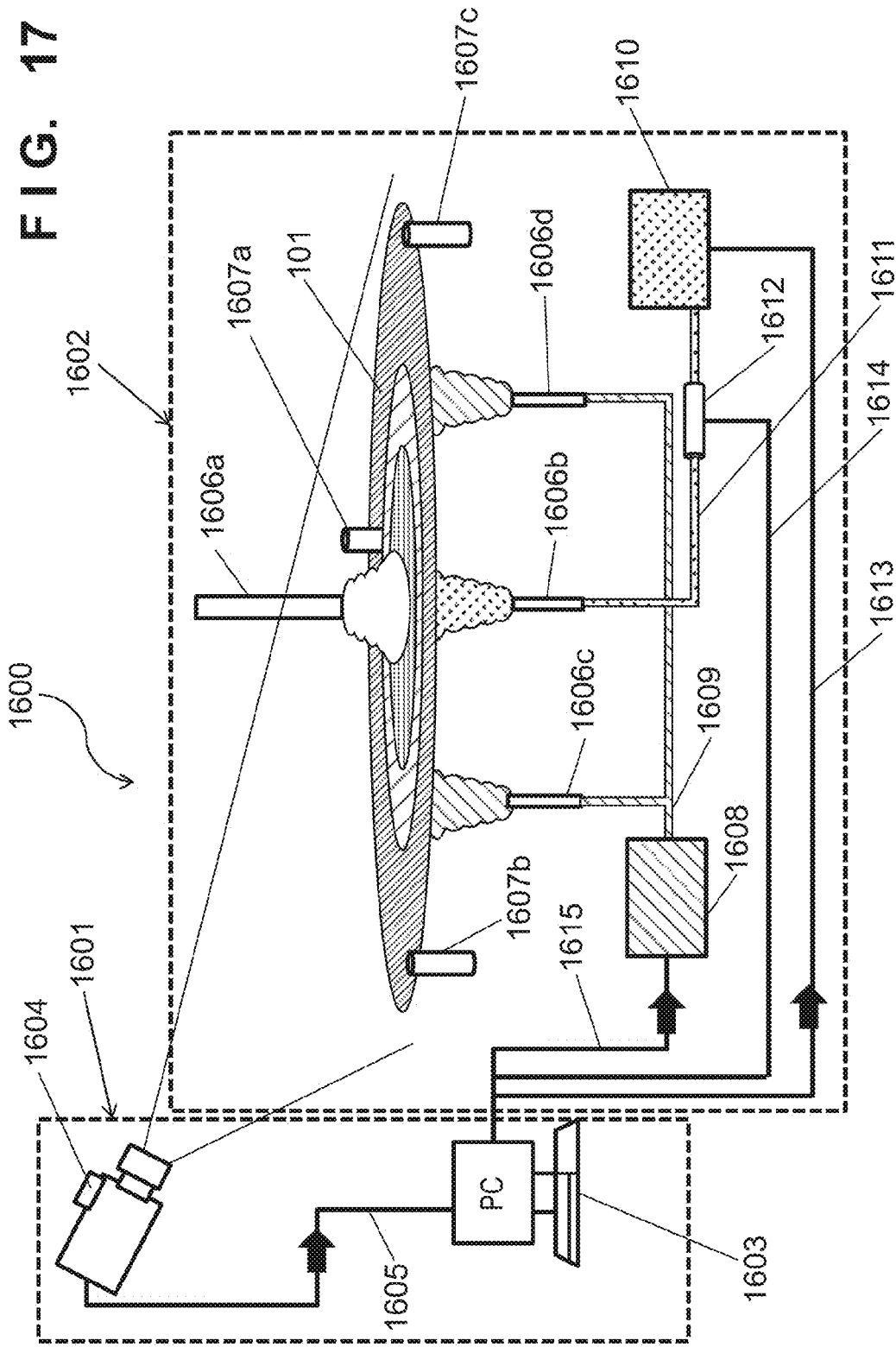
FIG. 17 is a schematic view for explaining an example of an etching system according to an embodiment.

FIG. 17 shows a first exemplary embodiment of a solution means to achieve the object of the present invention.

An etching system 1600 shown in FIG. 17 includes a subsystem 1601 and an etching apparatus main body 1602.

The subsystem 1601 includes a central control unit 1603 and a thermo camera 1604. The subsystem 1601 transfers data obtained by capturing and measuring an etching status as thermography by the thermo camera 1604 to the central control unit 1603 through a data transfer line 1605. Based on the transferred data, heating/cooling executed by the apparatus main body 1602 is controlled in a predetermined manner.

The apparatus main body 1602 includes a nozzle 1606a for supplying an etching chemical solution, a nozzle 1606b for discharging a heating solution, two nozzles 1606c and 1606d for discharging a cooling solution, three supporting means 1607a, 1607b, and 1607c for supporting an Si substrate 101 to undergo etching processing, a tank 1608 for storing the cooling solution, a supply line 1609 for supplying the cooling solution, a tank 1610 for storing the heating solution, a supply line 1611 for supplying the heating solution, and an instantaneous heating means 1612.

Each of transfer lines 1613, 1614, and 1615 for transferring a control signal is connected to a control target. The transfer line 1613 transfers a signal to keep the solution in the tank 1610 as its control target at a predetermined heating temperature. A signal transferred by the transfer line 1614 controls the instantaneous heating means 1612. This control operation can instantaneously control the temperature of the heating solution supplied by the supply line 1611 based on the measurement data of the thermo camera 1604, thereby keeping the temperature of the etched surface of the substrate 101 during etching processing free of position dependence. The control signal transferred by the transfer line 1615 instantaneously controls the temperature of the cooling solution in the tank 1608 at a predetermined temperature.

Experiment 5

Figure 18:
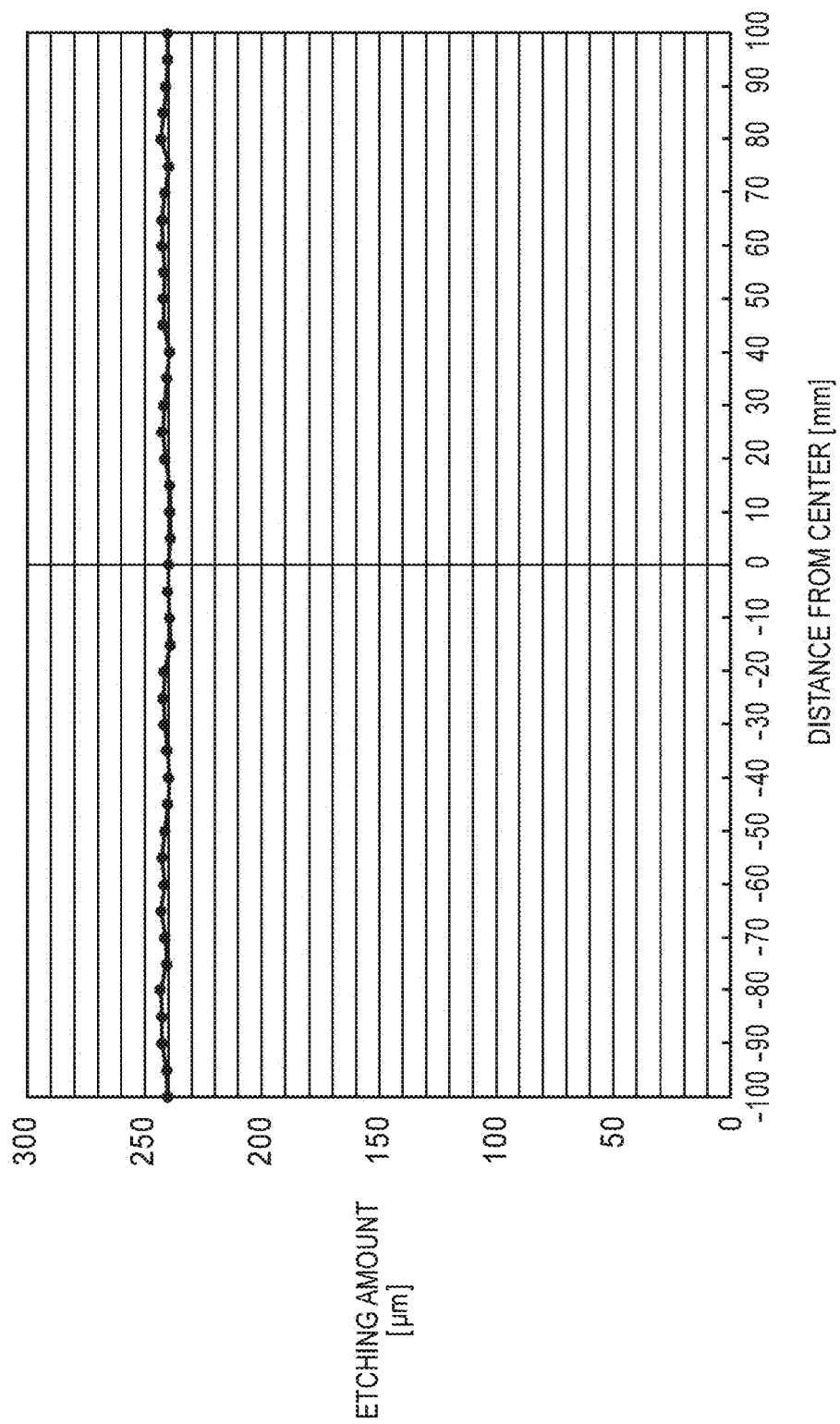
FIG. 18 is a graph for explaining an example of the position dependence of an etching amount when an embodiment is implemented in the etching system shown in FIG. 17.
Figure 19:
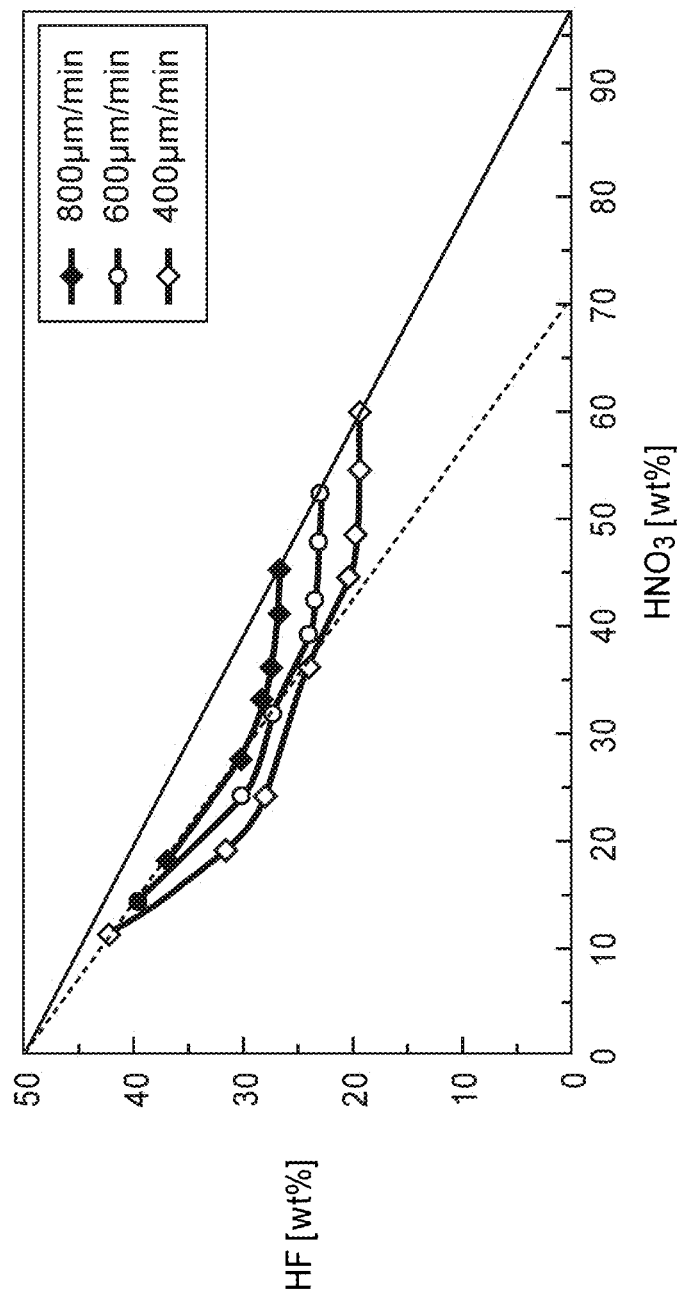
FIG. 19 is a graph described in NPL 1.

The etching system 1600 performed etching processing under the following conditions.
The etching processing conditions were as follows.
Etched sample . . . p-type Si wafer (substrate)
Etching chemical solution . . . fluonitric acid of HF/30%: $HNO_3$/28%
Chemical solution nozzle position and chemical solution supply . . . arrangement on the center axis and vertical drop and supply
Chemical solution supply amount . . . 3 L/min
Substrate rotation rate . . . 800 rpm
Control temperature . . . reaction temperature controlled at 85° C.
Experiment time . . . 15 sec
Upon completion of etching, the sample was rinsed by UPW (ultrapure water) at 5 L/min for 10 sec.
FIG. 18 shows the result. The etching rate was uniform within a very wide range (up to the outer peripheral portion of the substrate), thereby confirming the effect of the present embodiment.

The present invention is not limited to the above-described embodiments, and various changes and modifications can be made within the spirit and scope of the present invention. Therefore, to apprise the public of the scope of the present invention, the following claims are made.

REFERENCE SIGNS LIST

101 . . . Si substrate
102 . . . solution supply nozzle
400 . . . first laboratory apparatus
401 . . . dipping tank
402 . . . thermostatic chamber
403 . . . silicon wafer
404 . . . magnetic stirrer
600 . . . second laboratory apparatus
601 . . . tank
602, 609 . . . nozzle
603 . . . chemical solution supply line
604 . . . pump
605, 607, 608, 611 . . . valve
606 . . . return line
610 . . . solution supply line
612 . . . etching chemical solution
613 . . . heater
1300 . . . third laboratory apparatus according to present invention
1301 . . . substrate
1302 . . . supporting means
1303, 1304 . . . nozzle
1305 . . . etching chemical solution
1306 . . . coolant
1500 . . . fourth laboratory apparatus according to present invention
1600 . . . etching system according to present invention
1601 . . . subsystem
1602 . . . apparatus main body
1603 . . . central control unit
1604 . . . thermo camera
1605 . . . data transfer line
1606 . . . nozzle
1607 . . . supporting means
1608, 1610 . . . tank
1609 . . . cooling solution supply line
1611 . . . heating solution supply line
1612 . . . instantaneous heating means
1613, 1614, 1615 . . . control signal transfer line

What is claimed is:

1. An etching method comprising:
measuring a temperature of an Si substrate during an etching processing, wherein the etching processing comprises supplying an etching solution to an upper surface of the Si substrate, and an exothermic reaction occurs in the etching processing; and
heating and/or cooling the Si substrate by heating and/or cooling fluids which are discharged toward a lower surface of the Si substrate in accordance with temperature obtained in the measuring, wherein
the fluid for heating the Si substrate and the fluid for cooling the Si substrate are supplied from different nozzles, and the heating and cooling fluids are controlled independently.

2. An etching method comprising:
measuring a temperature of an Si substrate during an etching processing which comprises supplying a fluonitric acid solution to an upper surface of the Si substrate; and
heating and/or cooling the Si substrate by heating and/or cooling fluids which are discharged toward a lower surface of the Si substrate in accordance with temperature obtained in the measuring, wherein
the fluid for heating the Si substrate and the fluid for cooling the Si substrate are supplied from different nozzles, and the heating and cooling fluids are controlled independently.

3. An etching method comprising:
measuring a temperature of an Si substrate in a process of performing an etching processing for an upper surface of the Si substrate by supplying a fluonitric acid solution having a chemical composition of HF (a)-$HNO_3$ (b)-$H_2O$ (c) (a+b+c=100 and a+b≥50 where a, b, and c are numerical values each representing a concentration, and the unit of a, b, and c is wt %); and
heating and/or cooling the Si substrate by heating and/or cooling fluids which are discharged toward a lower surface of the Si substrate in accordance with temperature obtained in the measuring, wherein
the fluid for heating the Si substrate and the fluid for cooling the Si substrate are supplied from different nozzles, and the heating and cooling fluids are controlled independently.

4. The etching method according to claim 1, wherein the etching solution is supplied to a position shifted from a central axis of rotation of the Si substrate.

5. The etching method according to claim 2, wherein the etching solution is supplied to a position shifted from a central axis of rotation of the Si substrate.

6. The etching method according to claim 3, wherein the etching solution is supplied to a position shifted from a central axis of rotation of the Si substrate.

7. The etching method according to claim 1, wherein an outer edge of the Si substrate is supported by a plurality of a substrate supporting portions during the etching processing.

8. The etching method according to claim 2, wherein an outer edge of the Si substrate is supported by a plurality of a substrate supporting portions during the etching processing.

9. The etching method according to claim 3, wherein an outer edge of the Si substrate is supported by a plurality of a substrate supporting portions during the etching processing.

10. The etching method according to claim 1, wherein the etching solution is supplied to the upper surface of the Si substrate while rotating the Si substrate and a discharge direction of the etching solution supply is set to be parallel to the rotation direction of the Si substrate.

11. The etching method according to claim 2, wherein the etching solution is supplied to the upper surface of the Si substrate while rotating the Si substrate and a discharge direction of the etching solution supply is set to be parallel to the rotation direction of the Si substrate.

12. The etching method according to claim 3, wherein the etching solution is supplied to the upper surface of the Si substrate while rotating the Si substrate and a discharge direction of the etching solution supply is set to be parallel to the rotation direction of the Si substrate.

13. The etching method according to claim 1, wherein the temperature of the upper surface of the Si substrate is measured by a thermal camera.

14. The etching method according to claim 2, wherein the temperature of the upper surface of the Si substrate is measured by a thermal camera.

15. The etching method according to claim 3, wherein the temperature of the upper surface of the Si substrate is measured by a thermal camera.

16. The etching method according to claim 3, wherein the concentration of HF is not less than 19 wt % and not more than 42 wt %.

* * * * *